US006268561B1

(12) United States Patent
Buscella

(10) Patent No.: US 6,268,561 B1
(45) Date of Patent: Jul. 31, 2001

(54) SUPPLY TERMINAL BOARD INTEGRATING A NOISE FILTER AND CABLE CLAMP, IN PARTICULAR FOR ELECTRIC HOUSEHOLD APPLIANCES

(75) Inventor: Claudio Buscella, Gassino Torinese (IT)

(73) Assignee: I. T. W. Fastex Italia S.p.A., Turin (IT)

( * ) Notice: Subject to any disclaimer, the term of this patent is extended or adjusted under 35 U.S.C. 154(b) by 0 days.

(21) Appl. No.: 09/417,133

(22) Filed: Oct. 13, 1999

(30) Foreign Application Priority Data

Oct. 14, 1998 (IT) ..................... MI98A2211

(51) Int. Cl.[7] ..................... H01L 23/28

(52) U.S. Cl. ..................... 174/52.2; 174/52.1; 174/50.62; 361/679

(58) Field of Search ..................... 174/52.1, 52.2, 174/52.3, 50.62, 50.52, 251, 17 R, 175 F, 50, 50.5, 50.54, 60, 59; 361/679, 821; 439/604

(56) References Cited

U.S. PATENT DOCUMENTS 3,251,015 * 5/1966 Denham ..................... 336/96
4,455,538 * 6/1984 Kinzler ..................... 333/167
4,620,165 * 10/1986 Kinzler ..................... 333/167
4,760,357 * 7/1988 Yamaguchi ..................... 333/181
5,789,703 * 8/1998 Choi ..................... 174/50.62

* cited by examiner

*Primary Examiner*—Dean A. Reichard
*Assistant Examiner*—Carmelo B. Oliva
(74) *Attorney, Agent, or Firm*—Lowe Hauptman Gilman & Berner, LLP

(57) ABSTRACT

A terminal board including a cup-shaped body having a peripheral outer assembly flange substantially flush with an end wall of the cup-shaped body and in turn having click-on connecting means; a supporting base inserted inside the cup-shaped body and having, on a first face facing away from the end wall of the cup-shaped body, respective electrically conducting tracks, to which respective electronic components of a capacitive or capacitive-inductive noise filter are fixed, and respective, e.g. Faston-type, electric contacts of an insulated electric supply cable, the conducting terminals of the wires of the cable being connected to the conducting tracks, and the cable issuing from the cup-shaped body, on the first face side, through a corner recess defined by the base which is L-shaped; and electrically insulating resin filling and integral with the cup-shaped body, and in which are embedded the base with the electronic components, and at least an outwardly-extending portion of the insulated supply cable, so that the resin acts as a cable clamp.

10 Claims, 2 Drawing Sheets

SUPPLY TERMINAL BOARD INTEGRATING A NOISE FILTER AND CABLE CLAMP, IN PARTICULAR FOR ELECTRIC HOUSEHOLD APPLIANCES

The present invention relates to an integrated terminal board for supplying electric devices, in particular, electric household appliances such as washing machines, cookers with electric lighters, etc. In particular, the invention relates to a highly compact terminal board integrated with an electronic noise filter, and which is cheap and easy to produce.

BACKGROUND OF THE INVENTION

As is known, standards governing the electric components of electric household appliances require that the various components be supplied by means of terminal boards which can only be opened using tools, and which distribute electric current to the various user devices on the appliance by means of contacts supplied with current by a supply cable. Noise filters are also required to prevent the user devices on the appliance from generating electromagnetic noise; and the supply cable must be retained to prevent it, when pulled sharply, from being detached from the terminal board.

At present, all these requirements are met using separate devices. In particular, the noise filter is normally in the form of a separate component defined by a plastic body housing the electronic components and relative connections embedded in insulating resin; the body is fitted to the inside of the appliance body, and wires extend from the filter body and are connected downstream from the terminal board. This therefore calls for two specific assembly operations—in addition to those required to assemble the terminal board—whenever a filter is required, thus increasing the assembly cost of the appliance.

The terminal board, on the other hand, normally comprises a molded synthetic plastic box which, once the supply cable wires are connected to the various contacts, is closed and eventually made inaccessible in various ways (e.g. using irremovable connecting means between the cover and base of the terminal board), all of which are expensive systems calling for extra work in addition to actual assembly of the terminal board itself. To eliminate the above drawbacks, most currently known terminal boards feature a built-in cable clamp normally defined by a screw-operated pressure member for gripping the cable, and which therefore need not be produced as a separate element as in the past.

SUMMARY OF THE INVENTION

It is an object of the invention to eliminate the aforementioned drawbacks by providing an integrated terminal board also incorporating a noise filter (to reduce appliance assembly time and cost), and which, at the same time, is compact, highly reliable, and cheap and easy to produce and assemble.

According to the present invention, there is provided an integrated supply terminal board, in particular for electric household appliances, comprising a body made of electrically insulating material, an insulated electric supply cable carried integrally and inseparably by the body, and a number of electric contacts carried by the body and connected electrically to conducting terminals of respective electric wires of said cable; characterized by also comprising an electronic noise filter carried by a supporting base; said body being cup-shaped and internally defining an outwardly open cavity; the supporting base being inserted inside said cavity to at least partly close the cavity, and having respective electrically conducting tracks to which respective electronic components of said filter and said terminals of the cable wires are connected and secured; a first face of said base, facing away from said cavity, supporting in projecting manner said electric contacts, which are connected to said electrically conducting tracks, and said cable, which comes out of said cavity through a corner recess defined by the base which is L-shaped; said cavity being filled with an electrically insulating resin joined integrally to said body and in which are embedded the base with said electronic components and said wires, and at least a portion of cable issuing from said cavity and of such a length that the resin acts as a cable clamp.

By virtue of the particular general structure of the terminal board body described above, an operation which must be performed anyway—i.e. pouring of the insulating resin to safeguard operation of the electronic components of the filter—also provides for making the terminal board as a whole inaccessible, thus safeguarding against tampering, as well for retaining the cable (i.e. acting as a cable clamp) with no need for a special cable clamp device, which is defined by the resin itself and by the particular path imposed on the portion of cable embedded in the resin.

BRIEF DESCRIPTION OF THE DRAWINGS

A non-limiting embodiment of the invention will be described by way of example with reference to the accompanying drawings, in which.

DETAILED DESCRIPTION OF THE INVENTION

Figure 1:
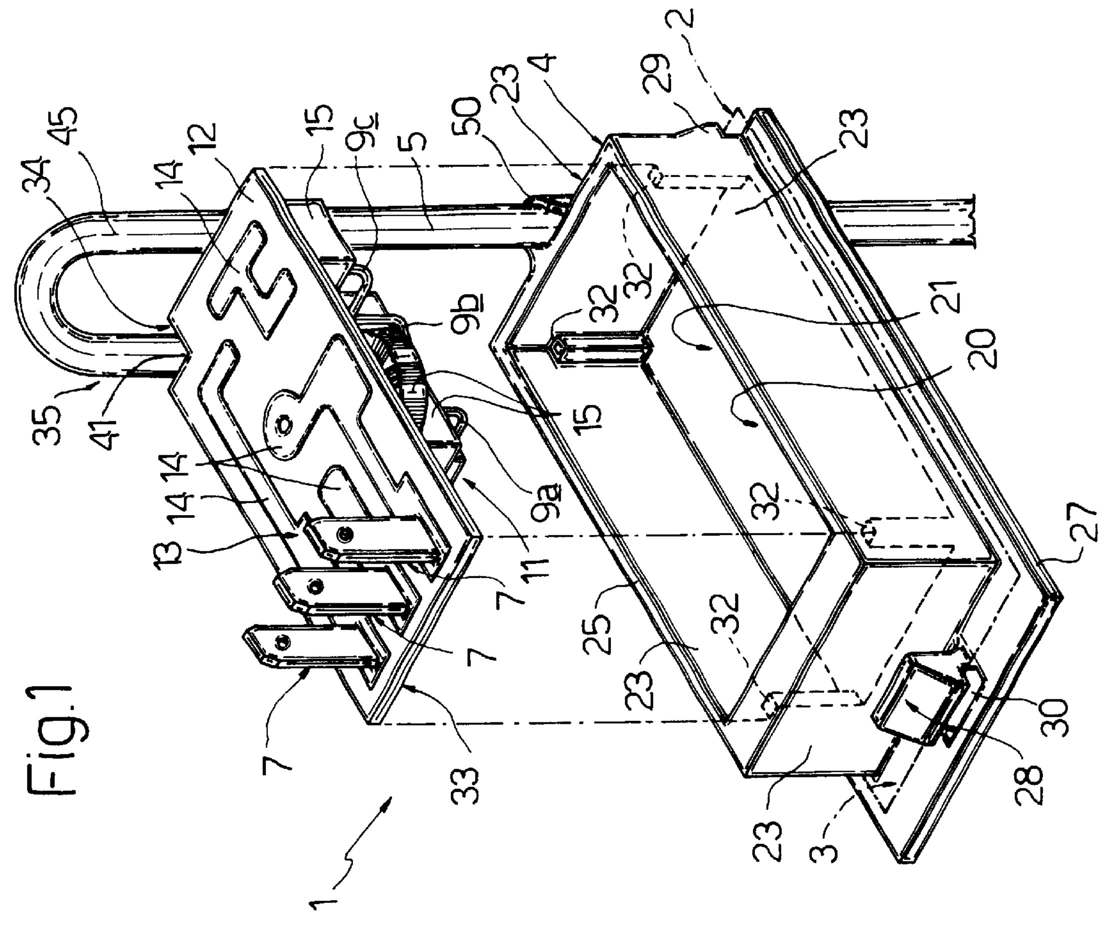
FIG. 1 shows an exploded, three-quarter front top view in perspective of a terminal board in accordance with the invention, at an intermediate fabrication stage.
Figure 3:
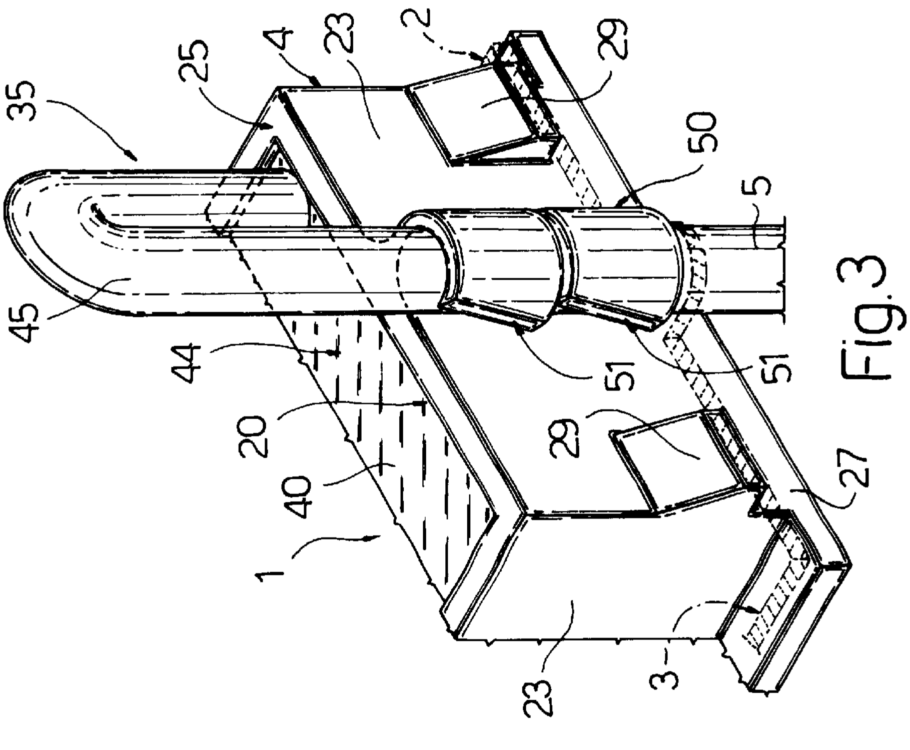
FIG. 3 shows a larger-scale view in perspective of a rear detail of the FIGS. 1 and 2 terminal board.
Figure 2:
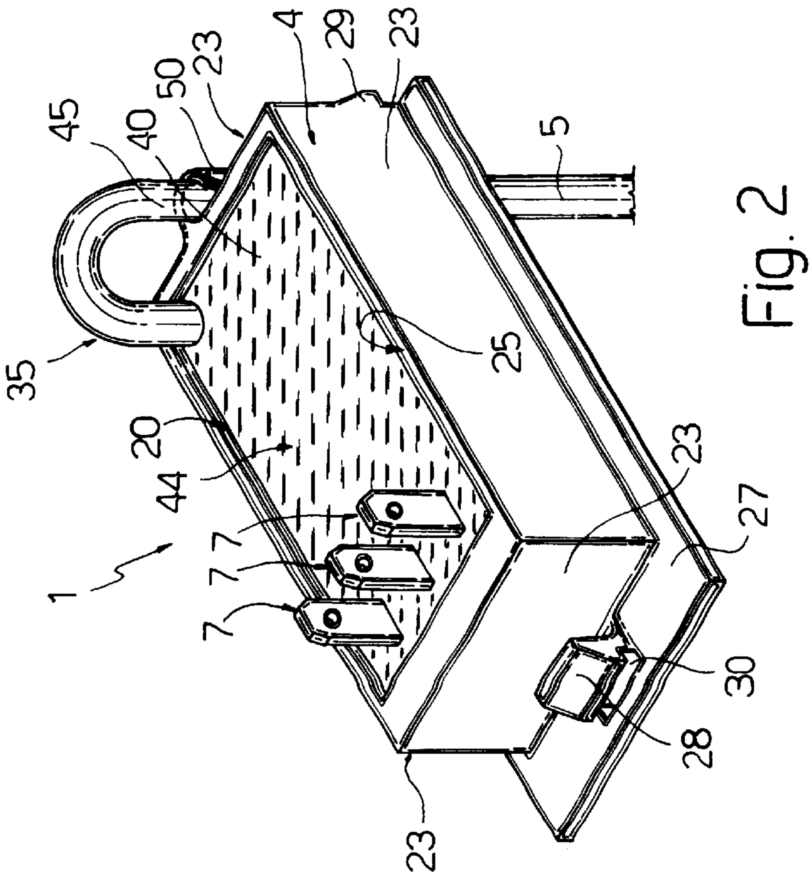
FIG. 2 shows the same view as in FIG. 1 of a finished terminal board in accordance with the invention.

Number 1 in FIGS. 1, 2 and 3 indicates as a whole an integrated terminal board for supplying, in conformance with regulations, a known electric device (not shown), in particular an electric household appliance, to the inside of the supporting and/or housing body of which terminal board 1 is fittable from the outside in known manner inside a seat 2 defined by the peripheral edge of a through opening 3 formed in the appliance body and indicated schematically by the dot-and-dash line.

Integrated terminal board 1 comprises a body 4 made of electrically insulating material, e.g. molded in one piece from synthetic plastic resin; an insulated electric supply cable 5 carried integrally by and inseparable from body 4, as described later on; and a number of electric contacts 7—in the example shown, three Faston blade contacts—carried integrally by body 4 and connected electrically in known manner to respective known bare conducting terminals (not shown) of respective insulated electric wires 9 of cable 5—typically, a ground wire 9*a*, a neutral wire 9*b*, and a line wire 9*c*. Terminal board 1 also comprises a known electronic noise filter (not shown in detail for the sake of simplicity) indicated as a whole by 11 and carried by a "printed circuit" type supporting base 12 defined, for example, by a sheet or plate of synthetic plastic or other electrically nonconducting material, and having, on one face 13, respective conducting tracks 14 forming the circuit of filter 11 and to which are secured integrally and connected electrically respective known electronic components 15 of filter 11, which, according to the invention, is a capacitive or capacitive-inductive filter.

According to the invention, body 4 is cup-shaped and defines internally an outwardly open cavity 20 (FIG. 1). More specifically, body 4—which is substantially parallelepipedal in the non-limiting example shown—comprises an end wall 21 and lateral walls 23, all combining to define cavity 20, the outward opening of which is defined by a mouth edge 25 in turn defined by walls 23. On the opposite side to edge 25, i.e. on the opposite side to the opening of cavity 20, body 4 comprises a peripheral outer assembly flange 27 substantially flush with end wall 21.

In actual use, flange 27 rests in known manner, inwards of opening 3, against the edge of opening 3, and comprises known click-on connecting means 28, 29 which cooperate with the edge of opening 3 as shown schematically in FIGS. 1 and 3 to click terminal board 1 inside seat 2 on the appliance. In the non-limiting example shown, the click-on connecting means comprise two rigid, step-shaped teeth or beaks 29 which rest on the inside of the edge of opening 3; and an elastically deformable tooth 28, which is located on the opposite side, flexes inside an opening 30 in flange 27, is inserted, in use, beneath the edge of opening 3, and clicks onto the inside of the edge of opening 3 to click terminal board 1 inside opening 3.

According to the invention, supporting base 12 of filter 11 is inserted inside and partly closes cavity 20. In the non-limiting example shown, face 13 of base 12 carrying conducting tracks 14 faces away from cavity 20; electric contacts 7 project from face 13; and the terminals of electric wires 9 are located on a second face 33 of base 12, on the opposite side to face 13 and facing end wall 21 of body 4. Base 12 is therefore inserted inside cavity 20 with face 33 resting on supports 32, so that the opposite face 13 is located close to edge 23, partly closing and slightly inwards of the opening of cavity 20 defined by edge 23, except for a through corner recess 34 defined by base 12, which is substantially L-shaped.

Recess 34 defines a passage to and from cavity 20 for cable 5, one end 35, with wires 9, of which is housed partly inside cavity 20. More specifically, like components 15, the conducting terminals (not shown) of wires 9 are connected mechanically and electrically, e.g. soldered, to tracks 14 and are therefore housed inside cavity 20 when base 12 is positioned resting on supports 32; and face 13 carries Faston electric contacts 7 projecting perpendicularly, and cable 5 extending from cavity 20 through corner recess 34 and projecting perpendicularly with respect to face 13. Contacts 7 are connected electrically, e.g. soldered, to tracks 14 in known manner (not shown) according to a given electric arrangement, or are formed in one piece with tracks 14 and cut and bent according to a known technique.

Finally, according to the core of the invention, cavity 20, once base 12 is assembled as described, is filled with electrically insulating resin 40. More specifically, resin 40 is poured in the liquid state inside cavity 20 through recess 34 (and possibly through other openings to the side of recess 34) which is so sized, notwithstanding cable 5, to enable the liquid resin 40 to penetrate inside cavity 20 and, once the portion of cavity 20 beneath base 12 is filled completely, to overflow up to a point flush with edge 25 to also incorporate base 12 and a whole portion 41 of cable 5 housed inside cavity 20 through recess 34. Upon the free surface of liquid resin 40 reaching edge 25, pouring is terminated and resin 40 is allowed to cool until it polymerizes and sets.

As it sets, therefore, resin 40 permanently encloses base 12, portion 41 of cable 5, wires 9 and components 15, and is joined integrally to walls 21, 23 so as to be incorporated permanently and substantially inseparably in body 4 (i.e. in such a way that separation is only possible by irreparably damaging terminal board 1) and so as to form, substantially flush with edge 23, a free surface 44 defining a further end wall of body 4 opposite end wall 21 and from which contacts 7 and cable 5 project perpendicularly.

According to the invention, the solidified resin 40 therefore fills the whole of cavity 20, is joined firmly and integrally to body 4 to form a single body, and encloses base 12, with all of components 15, wires 9 and the portion 41 of cable 5 (in the example shown, end 35) extending from cavity 20 through recess 34. According to the invention, cavity 20, base 12 and end 35 of cable 5 are so formed that portion 41 is of such a length, and so adheres to resin 40, that resin 40 grips and retains portion 41 in exactly the same way as a conventional cable grip device, and therefore provides not only for insulating components 15, but also, and above all, for gripping portion 41 of cable 5 and, by virtue of the adhesion of resin 40 to body 4, for sealing terminal board 1 and, in a straightforward, low-cost manner, for preventing the terminal board from being tampered with, as prescribed by regulations.

For optimum passage (in terms of grip) of cable 5, according to a further aspect of the invention, cable 5 is secured to body 4 so that end 35 forms a 180° U-shaped curve. A first branch of the U-shaped curve is defined by portion 41 which (FIGS. 2 and 3) in use is embedded in insulating resin 40 both along the portion projecting through recess 34 and along the portion issuing from body 4. A second branch 45 of the U-shaped curve, on the other hand, extends parallel to one of lateral walls 23—in the example shown, the lateral wall on the opposite side to tooth 28 and having teeth 29 on the outside—and towards flange 27, which is interrupted to enable branch 45 to extend beyond end wall 21.

More specifically, branch 45 is defined by a second portion of end 35 of cable 5, which is engaged inside a click-on retaining member 50 formed to define a compulsory passage for cable 5. Member 50 is hook-shaped, comprises an oblique, possibly saw-toothed, edge 51 (FIG. 3), and is formed integrally in one piece with and on the outside of body 4.

Cable 5 may obviously be of any shape, and may be secured to body 4 in a configuration other than the one described by way of example, providing it comprises a portion 41 embedded in resin 40 and on which resin 40 acts as a cable grip, and a portion (e.g. defining branch 45 described above) secured to body 4.

The terminal board described is assembled quickly and easily: once components 15 and wires 9 are all secured to tracks 14, base 12 is inserted, face 33 downwards, inside cavity 20 as shown in FIG. 1, after first forming end 35 of cable 5 into a U-shaped curve and inserting cable 5 through recess 34; and resin 40 is then poured in known manner up a point flush with edge 25. Once set, resin 40 incorporates the whole of base 12, together with the various components integral with the base, to simultaneously perform three functions: electrically insulate components 15; clamp cable 5 (cable grip function); and seal terminal board 1 to prevent tampering.

What is claimed is:

1. An integrated supply terminal board, in particular for electric household appliances, comprising a body made of electrically insulating material, an insulated electric supply cable carried integrally and inseparably by the body, and a number of electric contacts carried by the body and connected electrically to conducting terminals of respective electric wires of said cable; characterized by also comprising an electronic noise filter carried by an L-shaped supporting base; said body being cup-shaped and internally defining an outwardly open cavity; the supporting base being inserted inside said cavity to at least partly close the cavity, and having respective electrically conducting tracks to which respective electronic components of said filter and said terminals of the cable wires are connected and secured; a first face of said base, facing away from said cavity, supporting in projecting manner said electric contacts, which are connected to said electrically conducting tracks, and said cable, which comes out of said cavity through a corner recess defined by the L-shaped base; said cavity being filled with an electrically insulating resin joined integrally to said body and in which the base with said electronic components and said wires are embedded, and at least a portion of said cable issuing from said cavity and of such a length that the resin acts as a cable clamp.

2. A terminal board as claimed in claim 1, characterized in that said electrically conducting tracks are located on said first face of the base facing away from said cavity; said terminals of the cable wires being fixed to a second face of said base on the opposite side to the first face and facing said cavity.

3. A terminal board as claimed in claim 1, characterized in that said electronic noise filter is a capacitive or capacitive-inductive type.

4. A terminal board as claimed in claim 1, characterized in that said body comprises a peripheral outer assembly flange, which is located on the opposite side to a mouth of said cavity and substantially flush with an end wall of the cup-shaped body defining said cavity together with respective lateral walls of the cup-shaped body.

5. A terminal board as claimed in claim 4, characterized in that said flange rests against an edge of an opening in a wall of said appliance defining a seat for housing the terminal board inwards of the opening; and in that the flange comprises click-on connecting means which cooperate with said edge of the opening to click and lock the terminal board inside the seat.

6. A terminal board as claimed in claim 4, characterized in that said cable is secured to said body so as to form a U-shaped curve, a first branch of which is defined by said portion of said cable issuing from said cavity and which is embedded in said insulating resin and projects through said corner recess in said base and out of said body, and a second branch of which extends, parallel to and on the outside of a lateral wall of said body, towards said flange.

7. A terminal board as claimed in claim 6, characterized in that said second branch of the U-shaped curve formed by said cable is defined by a second portion of said cable which is engaged by a click-on retaining member defining a compulsory passage for the cable and formed integrally in one piece with and on the outside of said body.

8. A terminal board as claimed in claim 4, characterized in that said cable and said electric contacts project perpendicularly from a free surface of said resin, which is substantially flush with a mouth edge of said cavity located on the opposite side to said flange and defined by respective lateral walls of said body.

9. A terminal board as claimed in claim 8, characterized in that said electric contacts are blade-type contacts.

10. A terminal board as claimed in claim 1, characterized in that said corner recess defined by the L shape of said base is so sized as to enable said resin, in a liquid state, to penetrate said cavity and overflow from the corner recess to also incorporate said base.

* * * * *